(12) United States Patent
Keller et al.

(10) Patent No.: US 6,606,733 B2
(45) Date of Patent: Aug. 12, 2003

(54) METHOD AND SYSTEM FOR FINDING STATIC NAND AND NOR GATES WITHIN A CIRCUIT AND IDENTIFYING THE CONSTITUENT FETS EACH GATE

(75) Inventors: S Brandon Keller, Fort Collins, CO (US); Gregory Dennis Rogers, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 199 days.

(21) Appl. No.: 09/782,233

(22) Filed: Feb. 12, 2001

(65) Prior Publication Data

US 2002/0112215 A1 Aug. 15, 2002

(51) Int. Cl.[7] ............................................. G06F 17/50
(52) U.S. Cl. .................................... 716/4; 716/4; 716/2
(58) Field of Search ............................. 716/4, 5, 6, 12, 716/2, 10; 438/10; 326/10, 38

(56) References Cited

U.S. PATENT DOCUMENTS

| | | | |
|---|---|---|---|
| 6,077,717 A | 6/2000 | McBride | 438/10 |
| 6,260,180 B1 * | 7/2001 | McBride | 438/10 |
| 6,275,970 B1 * | 8/2001 | McBride | 326/41 |
| 6,295,632 B1 * | 9/2001 | McBride | 703/14 |
| 6,367,055 B1 * | 4/2002 | McBride | 716/2 |
| 6,367,062 B1 * | 4/2002 | McBride | 326/38 |
| 6,434,723 B1 * | 8/2002 | McBride et al. | 716/4 |

* cited by examiner

Primary Examiner—Matthew Smith
Assistant Examiner—Binh C. Tat (57) ABSTRACT

A method is disclosed for identifying FETs that comprise NAND and NOR logic gates in a circuit design having numerous FETs. A potential logic gate output node is queried to determine the configuration of FETs around the output node. FETs connected directly between the output node and either a high or low potential (VDD or GND) are identified and stored to memory along with a their corresponding gate signals. Branch FETs that are of a different type than the directly-connected FETs and that are channel-connected between the output node and either VDD or GND are also identified. If a gate signal for each FET in a branch corresponds to a gate signal of a directly-connected FET at the same output node, then a logic gate exists.

20 Claims, 7 Drawing Sheets

(Prior Art)

*Fig. 1a*

(Prior Art)

*Fig. 1b*

(Prior Art)

*Fig. 1c*

(Prior Art)

*Fig. 2a*

(Prior Art)

*Fig. 2b*

(Prior Art)

| GATE SIGNAL | FET |
|---|---|
| A | [P1] |
| B | [P2] |
| \ | \ |
| \ | \ |
| \ | \ |
| \ | \ |

| KEY | CONSTITUENT FETs |
|---|---|
| A:B | [N1, N2] |
| \ | \ |
| \ | \ |
| \ | \ |
| \ | \ |
| \ | \ |

METHOD AND SYSTEM FOR FINDING STATIC NAND AND NOR GATES WITHIN A CIRCUIT AND IDENTIFYING THE CONSTITUENT FETS EACH GATE

FIELD OF INVENTION

The present invention relates generally to electronic logic gates comprised of transistors. More particularly, it relates to a software method of identifying FETs associated with logic gates.

BACKGROUND

In the field of semiconductor chip design, it is desirable to identify the topology of a system. In the design process, proposed integrated circuit (IC) chip designs may be created using a computer system, such as an electronic design (E-CAD) computer aided drafting (CAD) application. A design may be stored in the computer system so that it may be tested before implementation. In particular, it is desirable to identify the topology of a design stored on a computer system by identifying constituent field effect transistors (FETs) that comprise logic gates. A design may have thousands or millions or more FETs on the chip, so it is impractical to identify topologies without using an automated method. Existing methods of identifying topologies are cumbersome because they fail to accurately identify the constituent FETs. Existing methods simply check for the presence of NAND or NOR topology without regard to the signals driving each constituent FET within each NAND or NOR gate.

Also, existing methods fail to properly account for "extra FETs." Often, extra FETs—those FETs that are not part of a NAND or NOR gate—may be connected to a node of the NAND or NOR gate. This presents a problem in existing methods, which assume no NAND or NOR gates are driving the node with the extra FET. In fact, this assumption is inaccurate. What is needed is an improved method of identifying the constituent FETs of NAND and NOR gates.

SUMMARY OF INVENTION

A method is disclosed for identifying FETs that comprise NAND and NOR logic gates in a circuit design having numerous FETs. A potential logic gate output node is queried to determine the configuration of FETs around the output node. FETs connected directly between the output node and either a high or low potential (VDD or GND) are identified. If the directly-connected FETs are p-type FETs (PFETs) connected between the output and VDD, then they potentially form part of a NAND gate, and are stored to memory, along with a gate signal that corresponds to each such directly-connected PFET. If the directly-connected FETs are n-type FETs (NFETs) connected between the output and GND, then they potentially form part of a NOR gate, and are stored to memory also along with their gate signals. Branch FETs that are of a different type than the directly-connected FETs and that are channel-connected between the output node and either VDD or GND are also identified. If a gate signal for each FET in a branch corresponds to a gate signal of a directly-connected FET at the same output node, then a logic gate exists. A list of these branch FETs and their corresponding gate signals is stored to memory. The stored branch FET information is compared to the information for the directly-connected FETs to identify the FETs that form the logic gate, based on their gate signals.

In use, to identify NAND gates, the method identifies PFETs that are directly connected between the output node and VDD. The method also identifies branch NFETs that are channel-connected from the output node to GND. The names of the PFET devices and their gate signals are recorded in a PFET hash table. The branch NFET device names and gate signal names are recorded in an NFET hash table if each of the gate signals on the branch NFETs is also present in the PFET hash table. The method compares the gate signals that appear in each hash table and cross-references the FET device names having those same gate signals. These devices and signals are output as the constituent FETs of the NAND gate having inputs of the gate signals.

The method is reversed for detection of NOR gates. The directly-connected FETs are NFETs connected between the output node and GND. The branch FETs will be channel-connected PFETs and the branch will extend from the output node to VDD. These devices and their gate signals are stored in respective hash tables. The method compares the signals that appear in each table and outputs these signals and the FET device names as the constituent FETs of the NOR gate having inputs of the gate signals.

DETAILED DESCRIPTION

Figure 1A:
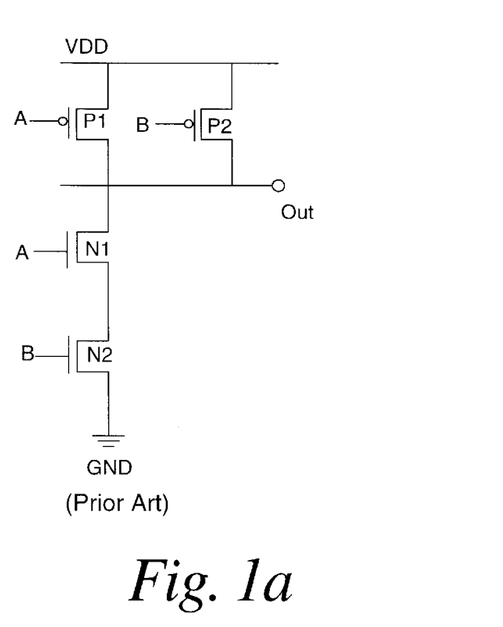
FIGS. 1A–1C show prior art NAND gates identified by the method.

FIG. 1A shows a circuit diagram of a 2-input NAND gate comprising two p-type FETs (PFETs) P1, P2 in parallel connected to a voltage VDD and to an output node of the NAND gate labeled "out." The logic gate also comprises two n-type FETs (NFETs) N1, N2 in series connected from the output node to ground. The path from the output node to GND through N1 and N2, and the paths from the output node to VDD through P1 and P2 may be referred to as branches. A branch refers to any circuit path through one or more FET from an output node. The branch may or may not terminate at GND or VDD. FET gate signals A and B form the NAND gate inputs in FIG. 1A. Each FET has a gate terminal for receiving a signal, such as A and B in FIG. 1A. Each FET has drain and source terminals connected directly or indirectly through other FETS to either the output node or to a potential labeled VDD or GND. The NAND gate may be part of an integrated circuit (IC) chip design stored in a computer memory, such as a very large scale integration (VLSI) design. A computer data file, such as a netlist, may maintain information about the FETs and other devices and connections in the design.

As used herein, the term "directly-connected" FET refers to a FET that is directly connected between an output node or potential output node of a logic gate and either VDD or GND, such as the PFETs in FIG. 1A. As used herein, the term "channel-connected" FET refers to a FET connected "in series" having a drain or source terminal connected to a drain or source terminal of another FET. For example, in FIG. 1A the NFETs are channel-connected FETs. Channel-connected FETs connected in series to other FETs between the output node and either VDD or GND, such as the NFETs shown in FIG. 1A, are referred to as "branch FETs." VDD and GND refer to electric potentials, where VDD is the higher potential or voltage and GND is the lower potential. In some designs, VDD may refer to the power source and GND may refer to a ground. "Output" or "output node" refers to a node under test that is potentially the output of a logic gate.

Figure 1B:
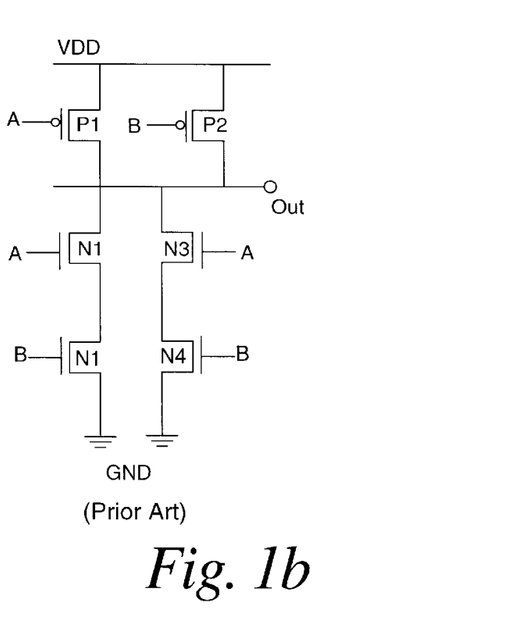
Figure 1C:
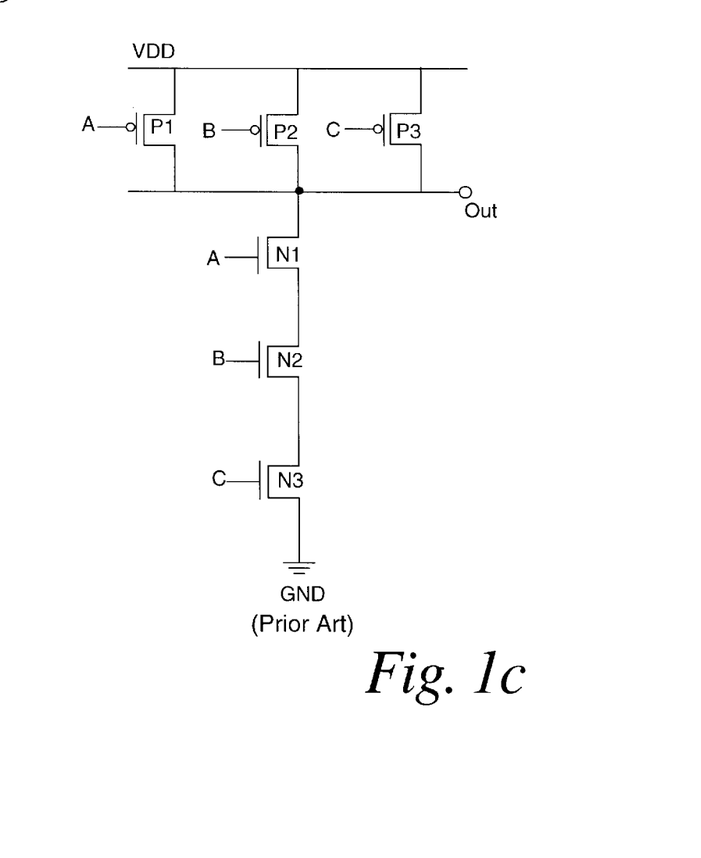

FIG. 1B shows an alternative embodiment of a 2-input NAND gate having additional n-type FETs. One skilled in the art will recognize that any number of configurations having varying numbers of FETs may be used to create the basic NAND gate, depending upon the physical dimensions of the FETs and the needs of the designer. FIG. 1C shows a 3-input NAND gate having inputs A, B, and C.

Figure 2A:
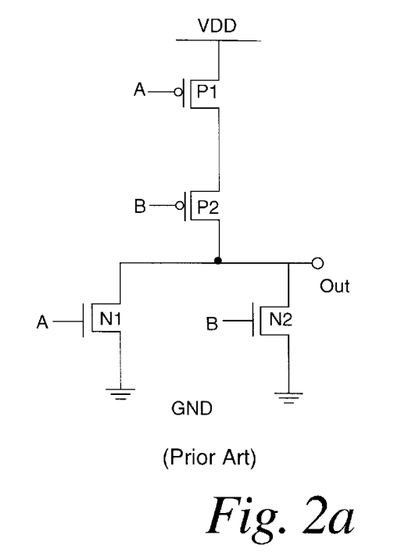
FIGS. 2A–2B show prior art NOR gates identified by the method.
Figure 2B:
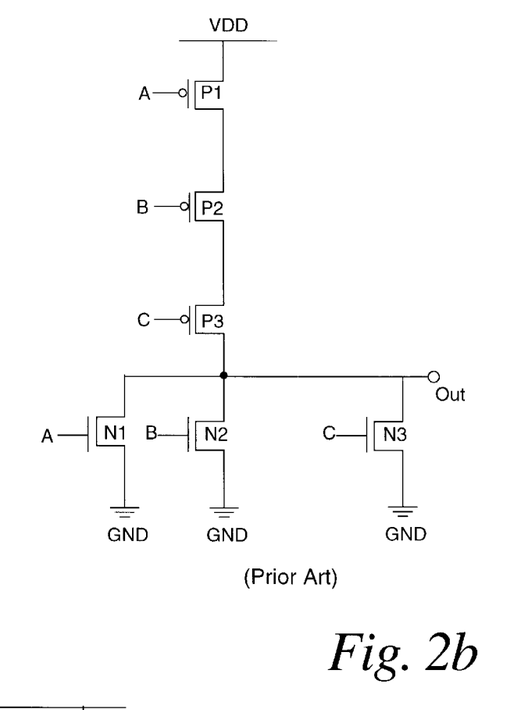

FIG. 2A shows a 2-input NOR gate comprising two p-type FETs in series (branch FETs) connected between a voltage VDD and an output node. The gate further comprises two n-type FETs connected in parallel (directly-connected FETs) between the output gate and the ground. Inputs A and B are the gate inputs. FIG. 2B shows a 3-input NOR gate having inputs A, B, and C.

Figure 3:
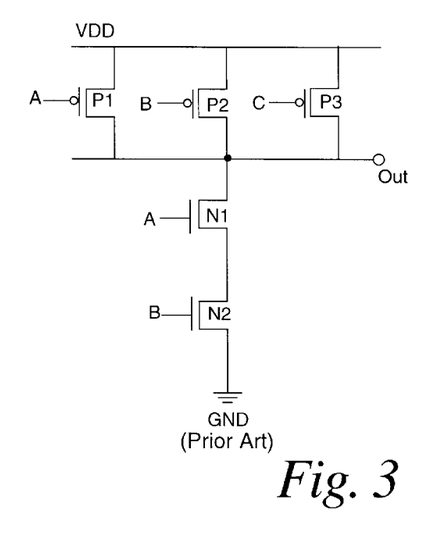
FIG. 3 shows prior art interconnected FETs including a NAND gate identified by the method.

FIG. 3 shows a schematic of a portion of a circuit having three p-type FETs connected from a voltage to an output node. FIG. 3 further shows two n-type FETs connected in series between the ground and the output node. FIG. 3 shows a 2-input NAND gate, having inputs A and B, plus an extra p-type FET having input C connected between the output node and the voltage VDD. Existing methods do not accurately determine the nature of the FETs in the example of FIG. 3 because they become confused by the extra FET.

Figure 4:
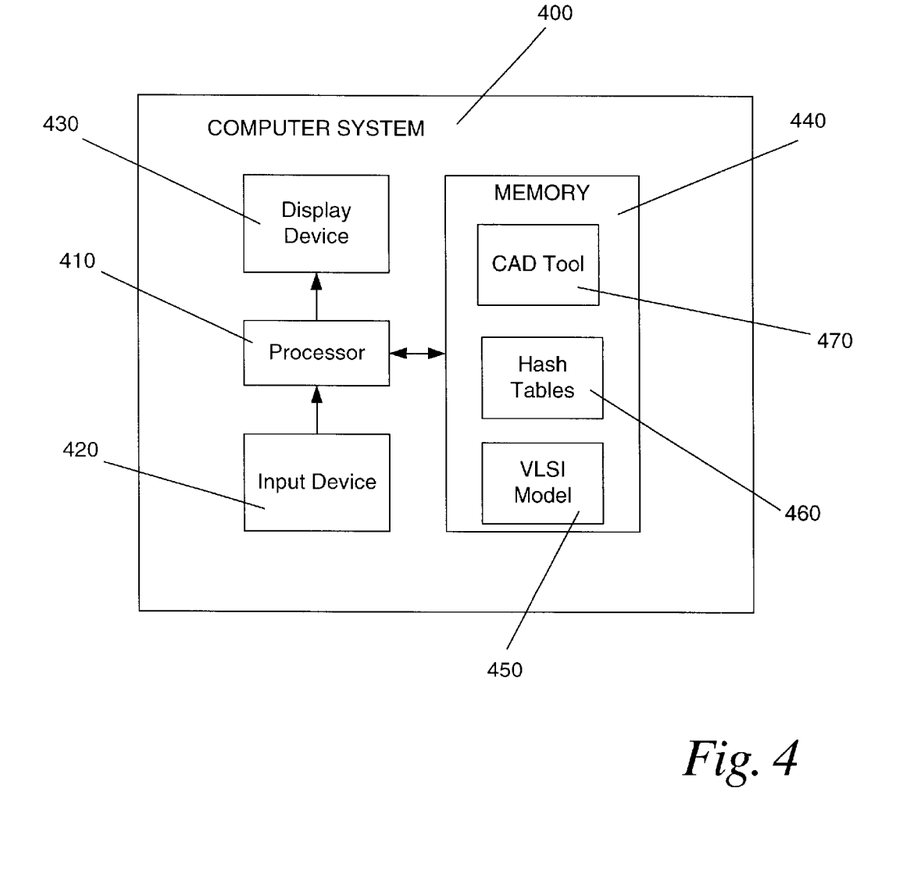
FIG. 4 shows a block diagram of a computer system on which the method may be performed.

FIG. 4 shows a block diagram of a computer system 400 having a processor 410 connected to an input device 420 and a display device 430. The processor 410 accesses memory 440 in the computer system 400 that stores a VLSI circuit model 450. A CAD tool 470 is also stored in the memory 440 for analyzing the circuit model 450. In use, the input device 420 receives commands instructing the processor 410 to call the CAD tool software 470 to perform a circuit analysis on the model 450. The results of the analysis may be displayed on the display device 430. During analysis, the processor 410 creates a data structure, such as a hash table 460, in memory 440 to store information about the FETs.

Figure 5:
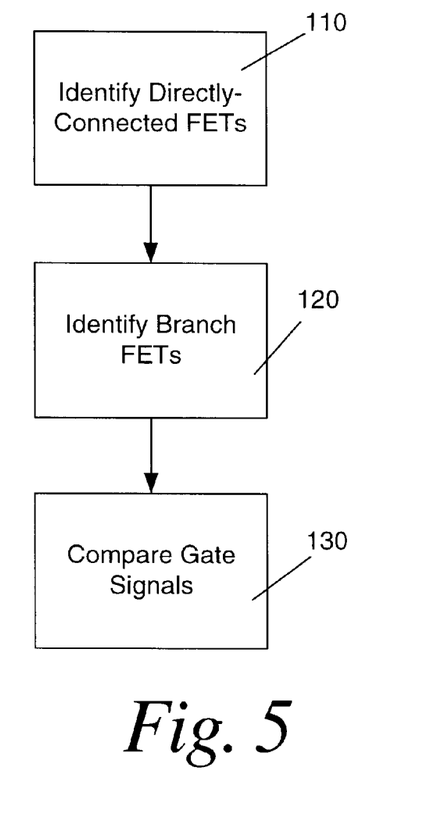
FIG. 5 shows a flow chart of the method for identifying either NAND or NOR gates.

FIG. 5 shows a flow chart of the method for finding either NAND or NOR gates. An output node is selected upon which the method is performed. The method can be implemented in, for example, software modules stored in memory 440 for execution by the processor 410. For the node under test, the method identifies 110 directly-connected FETs of a first type (either PFETs or NFETs). These may be multiple FETs having a drain and a source connected directly between the output node and a potential (either VDD or GND). In the case of a NAND gate, these would be PFETs connected between the output node and VDD. In the case of a NOR gate, these would be NFETs connected between the output node and GND. The method may store the name of the FET and the name of the gate signal of the FET. These names may be any identifier giving information about the FET and its gate signal.

The method identifies 120 any branch FETs connected to the output node. These may be multiple FETs having their drains and sources channel-connected in series between the output node and a potential (either VDD or GND). In the case of a NAND gate, these would be NFETs connected between the output node and GND. In the case of a NOR gate, these would be PFETs connected between the output node and VDD. Each gate signal for the constituent FETs in a particular branch is identified. The method compares 130 the names of the branch FET gate signals with the names of the directly-connected FET gate signals, which names may be stored in memory 440. If each of the gate signals of the constituent FETs of a branch are also gate signals in the directly-connected FETs related to the same output node, then the method concludes that a NAND or NOR gate exists having an output at the selected output node and having inputs as the common gate signals that are present in both the branch FETs and the directly-connected FETs. If there are other directly-connected FETs with different gate signals, then those FETs are not part of the logic gate. The results of the gate analysis may be output to the display device 430.

Figure 6:
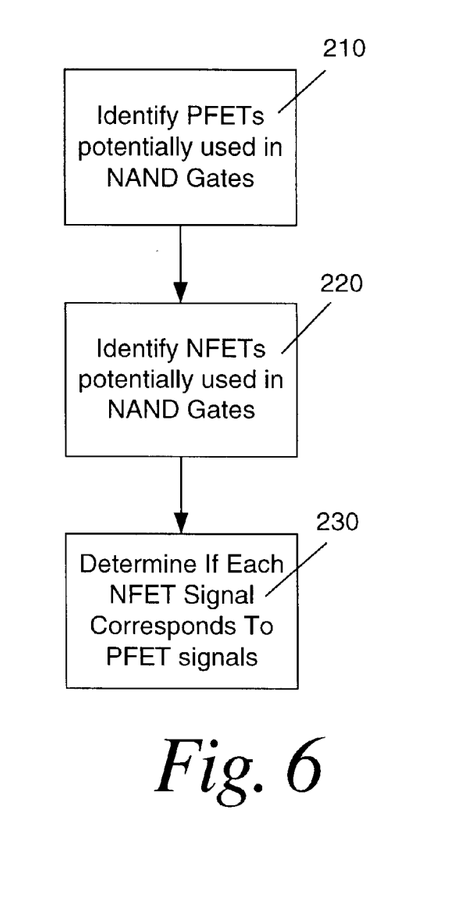
FIG. 6 shows a flow chart of the method for identifying NAND gates.

FIG. 6 shows a flow chart of the method as implemented for identifying NAND gates. Using a selected output node, the method identifies 210 directly-connected PFETs that are connected to the output node, which are potentially used in NAND gates. These are PFETs that are connected between VDD and a logic gate output. The method also identifies 220 branches connected to the output node, which are potentially used in NAND gates. These are branch NFETs connected between the output and GND in series with other NFETs. The method compares 230 the gate signals of the branch NFETs to the gate signals of the directly-connected PFETs. If each of the gate signals in the branch NFETs corresponds to a gate signal on a directly-connected PFET, then a NAND gate exists, having the common gate signals as its inputs. If additional directly-connected FETS with different gate signals exist in the design, then they are not part of the NAND gate.

Figure 7:
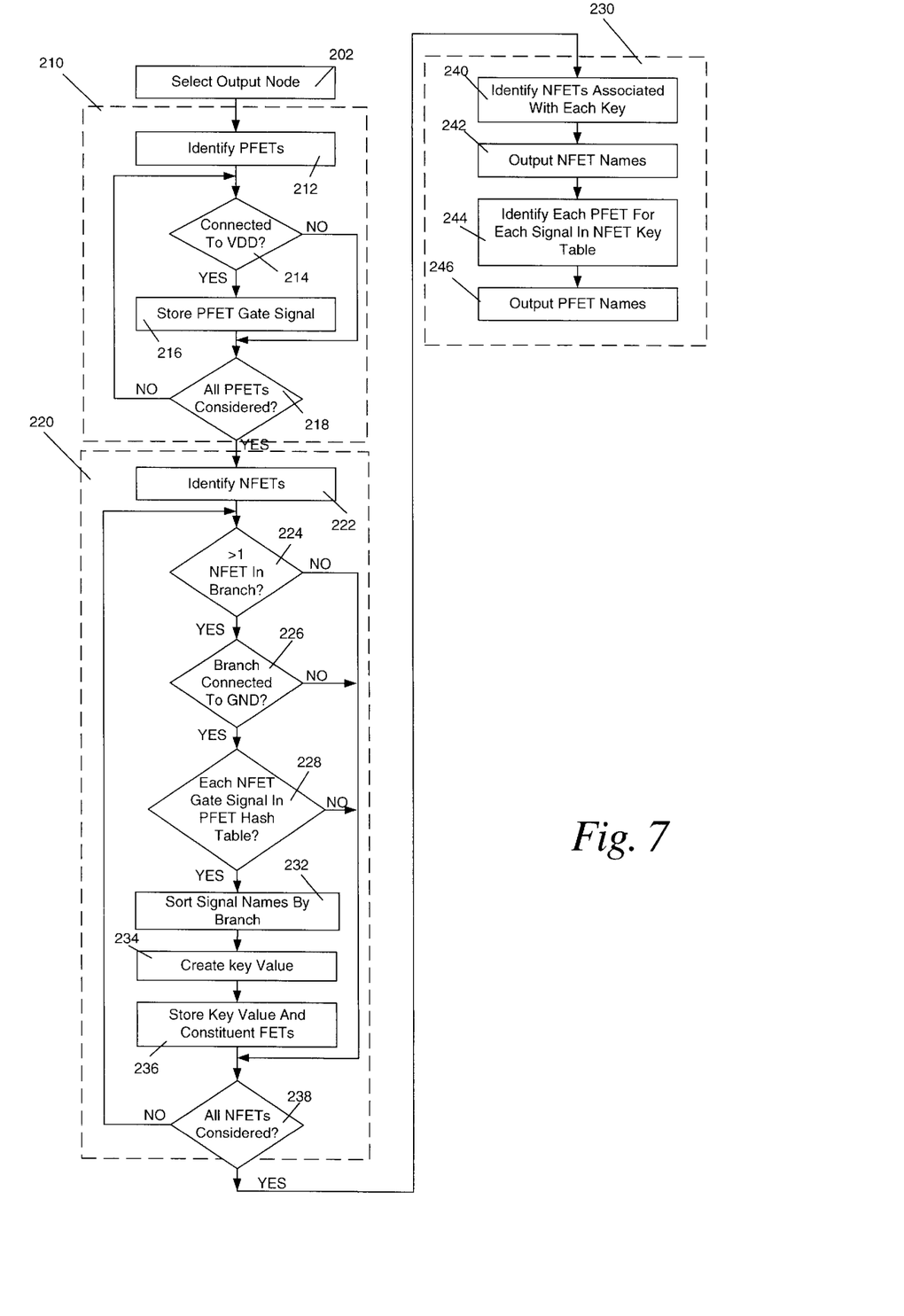
FIG. 7 shows a more detailed flow chart of the method shown in FIG. 6.

FIG. 7 shows a more detailed flow chart of one preferred embodiment the method for identifying NAND gates. A potential logic gate output node under test is selected 202. PFETs associated with the output node are identified 212. The method determines 214 whether a particular PFET is channel-connected between the output node and VDD. If it is, then the PFET name and the name of its gate signal are stored 216 in a data structure, such as a hash table. If the gate signal is already stored, then the FET name may be stored with the existing signal entry. This process of identifying 210 PFETs that are potentially used in NAND gates is repeated 218 until all PFETs are considered.

The method then identifies 222 the NFETs associated with the output node and determines 224 whether a branch has more than one NFET. If more than one branch NFET is channel-connected 224, then the method considers 226 whether the branch is connected to GND. If it is not connected to GND, then the method proceeds to the next NFET. If the branch is connected to GND, then the method determines 228 whether each NFET gate signal of the branch is stored in the PFET hash table. If each signal is not stored, then the method proceeds to examine the next NFET. If each signal is stored, then the method sorts 232 the signal names by branch. Based on the signal names, the method creates 234 key values that are the list of signals present in a branch. These key values are stored 236 in an NFET hash table along with the constituent FETs having these gate signals. If the key value is already stored in the hash table, then the list of constituent FETs may be added to the existing list of FETs corresponding to the key value. This process of identifying 220 NFETs that are potentially used in NAND gates continues until all NFETs have been considered 238.

Once the PFET names are stored in the PFET hash table and the NFET key values are stored in the NFET hash table, the method compares 230 the signals present in both tables to determine whether a NAND gate exists. Using the NFET hash table, the method identifies 240 NFETs associated with each key value. The names of the NFETs may be output 242. The method then identifies 244 each PFET having a gate signal that corresponds with an NFET gate signal. These PFETs may be output 246. The common signals are the inputs to the NAND gate, the potential output node is the output of the NAND gate, and the FETs identified are used in the NAND gate.

Figure 8A:
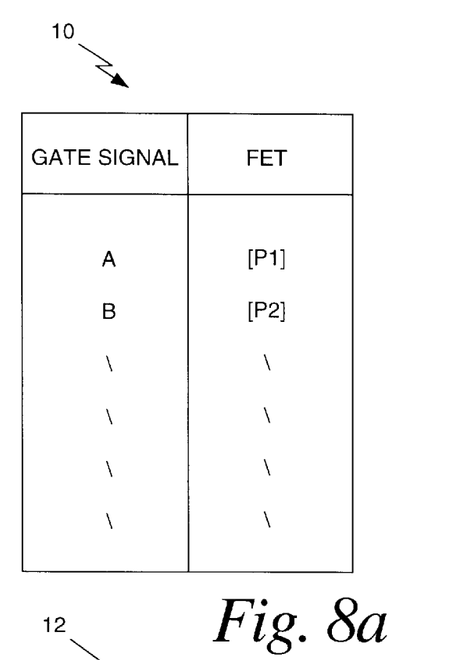
FIGS. 8A–8B show a hash tables used by the method.

FIG. 8A shows an example of a signal hash table 10 for storing signals related to particular gates. The signal hash table 10 may reside in memory 440 of the computer system 400. One column stores the name of gate signals. The other stores the corresponding FETs that receive those signals. The signal hash table 10 may be used to store signals and FETs related to the directly-connected FETs, and in the example of the NAND gate described in FIGS. 5 and 6, could be used to store information about the PFETs.

Figure 8B:
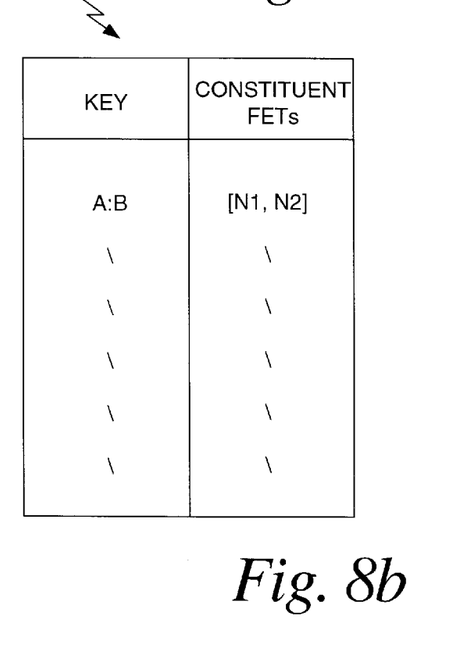

FIG. 8B shows an example of a key hash table 12 for storing relationships between branch FETs and signals. The key hash table 12 may also reside in memory 440 of a computer system 400. One column stores the names of signals in a single branch (key values). The other stores the corresponding constituent FETs in the branch. In the example of the NAND gate described in FIGS. 6 and 7, the key hash table 12 could be used to store information about the NFETs that form branches. Although hash tables are shown, any type of data structure can be used to store the information shown in FIGS. 8A and 8B.

Figure 9:
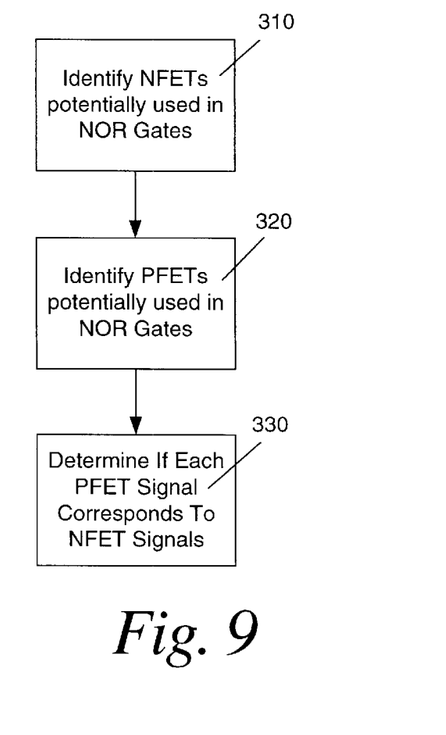
FIG. 9 shows a flow chart of the method for identifying NOR gates.

FIG. 9 shows a flow chart of another example application of the method of FIG. 5 as implemented in the identification of NOR gates. Using a selected output node, the method identifies 310 directly-connected NFETs that are connected to an output node, which are potentially used in NOR gates. These are NFETs that are connected between GND and a logic gate output. The method also identifies 320 branches connected to the output node, which are potentially used in NOR gates. These are branch PFETs connected between the output and VDD in series with other PFETs. The method compares 330 the gate signals of the branch PFETs to the gate signals of the directly-connected NFETs. If each of the gate signals in the branch PFETs corresponds to a gate signal on a directly-connected NFET, then a NOR gate exists, having the common gate signals as its inputs. If additional directly-connected FETS with different gate signals exist in the design, then they are not part of the NOR gate.

Figure 10:
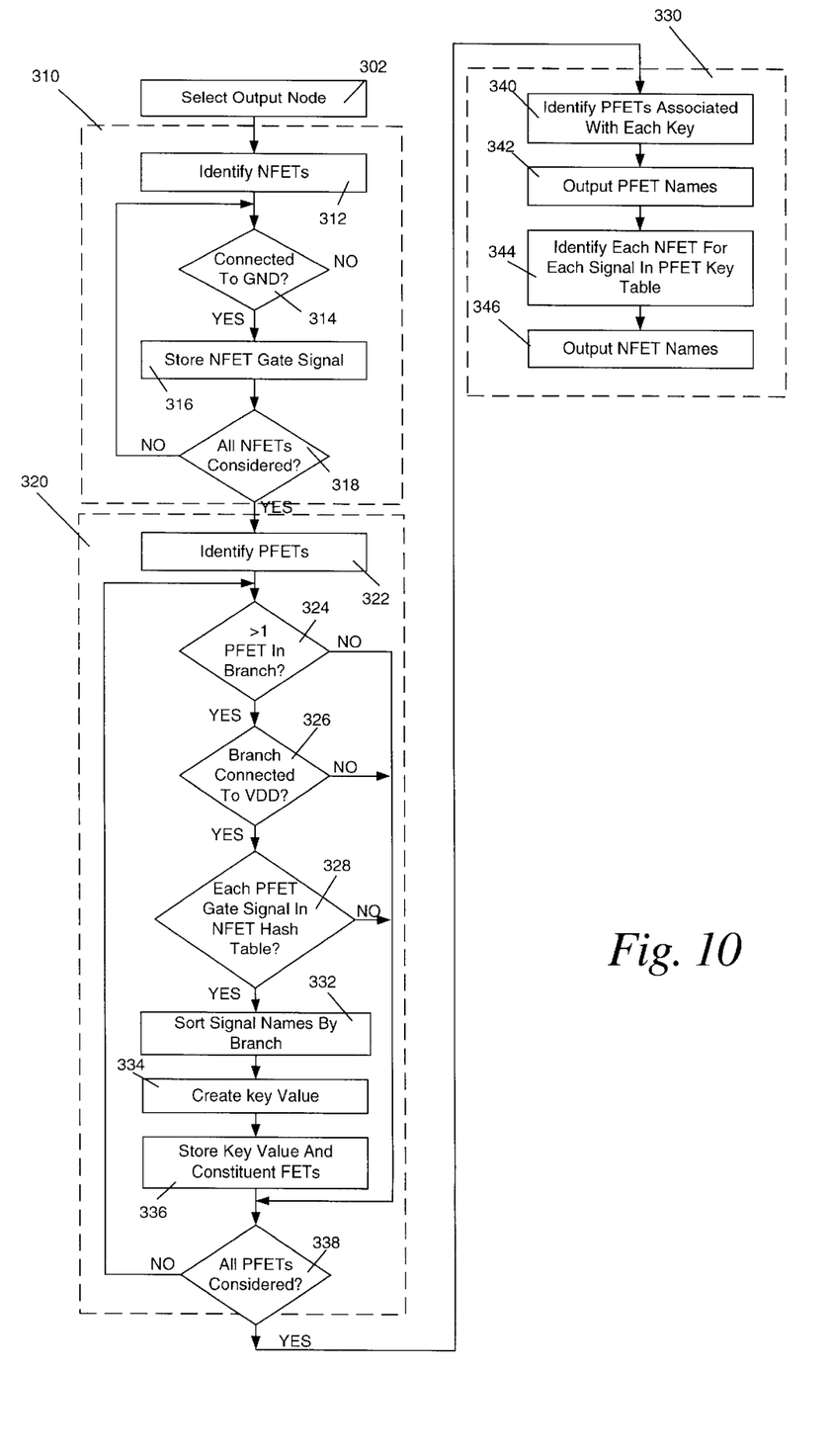
FIG. 10 shows a more detailed flow chart of the method shown in FIG. 9.

FIG. 10 shows a more detailed flow chart of one embodiment the method for identifying NOR gates. A potential logic gate output node under test is selected 302. NFETs associated with the output node are identified 312. The method determines 314 whether a particular NFET is channel-connected between the output node and GND. If it is, then the NFET name and the name of its gate signal are stored 316 in a hash table, such as the tables shown in FIGS. 8A and 8B. If the gate signal is already stored in the hash table, then the FET name may be stored with the existing signal entry. This process of identifying 310 NFETs that are potentially used in NOR gates is repeated 318 until all NFETs are considered.

The method then identifies 322 the PFETs associated with the output node and determines 324 whether a branch has more than one PFET. If more than one branch PFET is channel-connected 324, then the method considers 326 whether the branch is connected to VDD. If it is not connected to GND, then the method proceeds to the next PFET. If the branch is connected to GND, then the method determines 328 whether each PFET gate signal of the branch is stored in the NFET hash table. If each signal is not stored, then the method proceeds to examine the next PFET. If each signal is stored, then the method sorts 332 the signal names by branch. Based on the signal names, the method creates 334 key values that are the list of signals present in a branch. These key values are stored 336 in a PFET hash table along with the constituent FETs having these gate signals. If the key value is already stored in the hash table, then the list of constituent FETs may be added to the existing list of FETs corresponding to the key value. This process of identifying 320 PFETs that are potentially used in NOR gates continues until all PFETs have been considered 338.

Once the NFET names are stored in the NFET hash table and the PFET key values are stored in the PFET hash table, the method compares 330 the signals present in both tables to determine whether a NOR gate exists. Using the PFET hash table, the method identifies 340 PFETs associated with each key value. The names of the PFETs may be output 342. The method then identifies 344 each NFET having a gate signal that corresponds with an PFET gate signal. These NFETs may be output 346. The common signals are the inputs to the NOR gate, the potential output node is the output of the NOR gate, and the FETs identified are used in the NOR gate.

Although the present invention has been described with respect to particular embodiments thereof, variations are possible. The present invention may be embodied in specific forms without departing from the essential spirit or attributes thereof. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or read-only memory (ROM). It is desired that the embodiments described herein be considered in all respects illustrative and not restrictive and that reference be made to the appended claims and their equivalents for determining the scope of the invention.

We claim:

1. A method for identifying logic gates in an circuit design comprising:

identifying directly-connected FETs of a first type connected to an output node and having gate signals;

identifying branch FETs of a second type connected to the output node and having gate signals;

for at least one of the identified FETS, storing a name of the FET and a name of a gate signal that corresponds to the RET; and     comparing the directly-connected FET gate signals to the branch FET gate signals to identify the logic gates, wherein the step of comparing comprises cross-referencing names of the directly-connected FET gate signals or the branch FET gate signals with the name of the stored gate signal.

2. The method of claim 1, wherein step of storing the name and the gate signal comprises storing a FET name and a gate signal name for at least one of the directly-connected FETs, and wherein the step of comparing further comprises comparing a name of at least one of the branch gate signals to the stored gate signal.

3. The method of claim 1, wherein the comparing step comprises identifying a NAND gate by identifying the directly-connected FETs as PFETs connected to VDD and identifying the branch FETs as NFETs connected in series from the output node to GND.

4. The method of claim 1, wherein the comparing step comprises identifying a NOR gate by identifying the directly-connected FETs as NFETs connected to GND, and identifying the branch FETs as PFETs connected in series from the output node to VDD.

5. The method of claim 1, wherein the steps of identifying directly-connected FETs and identifying branch FETs comprise reading information from a computer data file that represents a circuit design.

6. The method of claim 1, wherein the logic gates are static logic gates.

7. The method of claim 1,
wherein the step of storing comprises storing FET names and gate signal names for each of the identified directly-connected FETs in one or more hash tables;
further comprising creating key values that identify gate signals present in a branch; and
wherein the step of comparing comprises using the key values to identify the logic gates.

8. A computer-readable medium having computer-executable instructions for performing a method for identifying logic gates in an circuit design, the method comprising:
identifying directly-connected FETs of a first type connected to an output node and having gate signals;
identifying branch FETs of a second type connected to the output node and having gate signals;
for at least one of the identified FETS, storing a name of the FET and a name of a gate signal that corresponds to the FET; and
comparing the directly-connected FET gate signals to the branch FET gate signals to identify the logic gates, wherein the step of comparing comprises cross-referencing names of the directly-connected FET gate signals or the branch FET gate signals with the name of the stored gate signal.

9. The medium of claim 8, wherein the step of storing the name and the gate signal comprises storing a FET name and a gate signal name for at least one of the directly-connected FETs, and wherein the step of comparing further comprises comparing a name of at least one of the branch gate signals to the stored gate signal.

10. The medium of claim 8, wherein the comparing step comprises identifying a NAND gate by identifying the directly-connected FETs as PFETs connected to VDD and identifying the branch FETs as NFETs connected in series from the output node to GND.

11. The medium of claim 8, wherein the comparing step comprises identifying a NOR gate by identifying the directly-connected FETs as NFETs connected to GND, and identifying the branch FETs as PFETs connected in series from the output node to VDD.

12. The medium of claim 8, wherein the steps of identifying directly-connected FETs and identifying branch FETs comprise reading information from a computer data file that represents a circuit design.

13. The medium of claim 8, wherein the logic gate is a static logic gate.

14. The medium of claim 8,
wherein the step of storing comprises storing FET names and gate signal names for each of the identified directly-connected FETs in one or more hash tables;
wherein the method further comprises creating key values that identify gate signals present in a branch; and
wherein the step of comparing comprises using the key values to identify the logic gates.

15. A computer system for identifying constituent FETs of a NAND or a NOR gate in a circuit design comprising:
a storage medium; and
a processor for executing a software program stored on the storage medium for identifying the constituent FETs, the software program comprising a set of instructions for:
identifying directly-connected FETs of a first type connected to an output node;
identifying branch FETs of a second type connected to the output node and having gate signals;
for at least one of the identified FETS, storing a name of the FET and a name of a gate signal that corresponds to the FET; and
comparing the directly-connected FET gate signals to the branch FET gate signals to identify the logic gates, wherein the step of comparing comprises cross-referencing names of the directly-connected FET gate signals or the branch FET gate signals with the name of the stored gate signal.

16. The system of claim 15, wherein the step of storing the name and the gate signal comprises storing a FET name and a gate signal name for at least one of the directly-connected FETs, and wherein the step of comparing further comprises comparing a name of at least one of the branch gate signals to the stored gate signal.

17. The system of claim 15, wherein the comparing step comprises identifying a NAND gate by identifying the directly-connected FETs as PFETs connected to VDD and identifying the branch FETs as NFETs connected in series from the output node to GND.

18. The system of claim 15, wherein the comparing step comprises identifying a NOR gate by identifying the directly-connected FETs as NFETs connected to GND, and identifying the branch FETs as PFETs connected in series from the output node to VDD.

19. The system of claim 15, wherein the steps of identifying directly-connected FETs and identifying branch FETs comprise reading information from a computer data file that represents a circuit design.

20. The system of claim 15,
wherein the step of storing comprises storing FET names and gate signal names for each of the identified directly-connected FETs in one or more hash tables;
further comprising a set of instructions for creating key values that identify gate signals present in a branch; and
wherein the step of comparing comprises using the key values to identify the logic gates.

* * * * *